United States Patent [19]

Fusaroli et al.

[11] 3,885,999

[45] May 27, 1975

[54] PLANAR EPITAXIAL PROCESS FOR MAKING LINEAR INTEGRATED CIRCUITS

[75] Inventors: Marzio Fusaroli, Milan; Alessandro Pecorella, Savona, both of Italy

[73] Assignee: Ates Componenti Elettonici S.p.A., Agrate Brianza, Italy

[22] Filed: Dec. 12, 1972

[21] Appl. No.: 314,475

[30] Foreign Application Priority Data

Dec. 15, 1971 Italy .................................. 32459/71

[52] U.S. Cl. ..................... 148/175; 29/576; 29/577; 29/578; 117/201; 117/212; 148/187; 148/191; 357/20; 357/35; 357/40; 357/48; 357/51; 357/88

[51] Int. Cl. ........................... H01l 7/36; H01l 27/04

[58] Field of Search .................... 148/175, 187, 191; 317/234, 235, 357, 20, 35, 40, 48, 51, 88; 29/576, 577, 578; 117/201, 212

[56] References Cited

UNITED STATES PATENTS

| | | | |
|---|---|---|---|
| 3,305,913 | 2/1967 | Loro | 317/235 X |
| 3,309,537 | 3/1967 | Archer | 317/235 E |
| 3,377,526 | 4/1968 | Beale et al. | 317/235 |
| 3,432,920 | 3/1969 | Rosenzweig | 29/578 |
| 3,458,781 | 7/1969 | Simon | 317/235 |
| 3,473,090 | 10/1969 | Bohannon | 317/235 |
| 3,474,309 | 10/1969 | Stehlin | 317/235 |
| 3,551,221 | 12/1970 | Yanagawa | 148/175 |
| 3,581,164 | 5/1971 | Pfander et al. | 317/234 |
| 3,667,006 | 5/1972 | Ruegg | 317/235 |
| 3,736,478 | 5/1973 | Veloric | 317/235 |

OTHER PUBLICATIONS

WU, W. W., "High-Speed Transistor," I.B.M. Tech. Discl. Bull., Vol. 11, No. 5, Oct. 1968, p. 448.

*Primary Examiner*—L. Dewayne Rutledge
*Assistant Examiner*—W. G. Saba
*Attorney, Agent, or Firm*—Karl F. Ross; Herbert Dubno

[57] ABSTRACT

An integrated circuit, including several juxtaposed units such as a low-ohmic resistance, an NPN power transistor and a PNP lateral transistor, is produced by forming a corresponding number of N+ strata side by side on a substrate of P-type silicon, epitaxially growing an N-type layer on that substrate to imbed the N+ strata therebetween, isolating the several units from one another by diffusing P-type impurities in intervening regions to divide the N-type layer into sections separated by P-type zones unitary with the substrate, and doping the resulting N-layer sections at selected areas with impurities of either conductivity type through windows formed in an overlying film of silicon oxide. The introduction of P-type impurities is preceded in each case by a more concentrated doping of all or part of the respective area with P+ impurities, followed by a simultaneous diffusion of the P and P+ impurities to a predetermined depth within the respective N-layer sections to form P-type enclaves therein to which metallic terminals are subsequently applied.

3 Claims, 20 Drawing Figures

PLANAR EPITAXIAL PROCESS FOR MAKING LINEAR INTEGRATED CIRCUITS

Our present invention relates to a process for producing integrated circuitry, more particularly a planar epitaxial process for the simultaneous production of several juxtaposed units.

It is known to build such units, e.g. transistors, diodes or resistors, by starting with a substrate of semiconductive silicon of one conductivity type, e.g. P type, and forming thereon a plurality of spaced-apart strata with a highly concentrated doping of the opposite conductivity type (e.g. N+), these strata being subsequently embedded between the substrate and a semiconductive silicon layer of opposite conductivity type (e.g. N) epitaxially grown thereon. This layer can then be split into several isolated sections, respectively overlying the several strata, by diffusing impurities of the first conductivity type (P) in intervening regions between these strata; the zones permeated by these impurities eventually merge with the substrate to form extensions thereof both between the strata and between the overlying layer sections.

A silicon body so prepared can now be further treated to transform parts of the several layer sections, which are of the second conductivity type (N), into enclaves of the first conductivity type (P) by doping selected surface areas of these sections with the corresponding impurities. These enclaves may serve, for example, as transistor bases, emitters or collectors or as low-ohmic resistors. External connections to these circuit elements may be provided by the application of metallic terminals to their surfaces.

The general object of our invention is to provide a method of lowering the resistivity of one or more of the aforementioned enclaves in order to improve the performance of the circuit.

A more particular object is to provide a method of controlling the simultaneous formation of such enclaves in a plurality of juxtaposed integrated-circuit units of different character, such as transistors and resistors.

We have found, in accordance with the present invention, that an effective lowering of resistivity is achieved by initially doping the selected surface areas of the isolated layer sections with highly concentrated impurities of one conductivity type (P+) and thereafter introducing less concentrated impurities of the same type (P) into these sections at the selected surface areas, with subsequent simultaneous diffusion of both the highly concentrated and the less concentrated impurities to a predetermined depth into these sections toward the embedded strata of opposite conductivity type (N+).

Advantageously, the two doping steps just described are preceded by the formation of a film of silicon oxide on the epitaxially grown layer of opposite conductivity type (N), this film having windows at the selected surface areas. The film may be produced, in a manner known per se, by oxidation and chemical removal of the oxide in areas marked by an overlying, photochemically produced masking layer which can be subsequently eliminated by mechanical or chemical means; the exposed silicon surface at these areas is then chemically treated (etched) to facilitate doping.

In some instances, the doping with highly concentrated impurities (P+) may encompass a narrower area of a layer section than the subsequent introduction of less concentrated impurities (P) at the same general location.

We have found that transistors formed in this way have a considerably higher gain than those conventionally produced by epitaxial techniques and that elemental resistors so obtained are of greatly reduced specific resistivity whereby a multiplicity of such elemental resistors can be combined into a network of desired overall resistance within much narrower tolerance limits.

The above and other features of our invention will now be described in detail with reference to the accompanying drawing in which FIGS. 1–18 schematically illustrate successive steps in the formation of a 3-unit integrated circuit by a planar epitaxial process according to our invention;

FIG. 19 is a graph relating to the performance of a transistor forming part of the structure of FIG. 18; and FIG. 20 is a plan view of an array of power transistors of a type schematically illustrated in FIG. 18.

The diagrams of FIGS. 1–18, which are cross-sectional views of a monocrystalline silicon body, are divided into three parts A, B and C representing different units simultaneously produced on that body. More particularly, unit A is a low-ohmic resistor (of resistance less than 500 Ω), unit B is an NPN power transistor and unit C is a PNP transistor of the lateral type.

FIG. 1 shows a semiconductive silicon substrate 1, in the usual wafer form, doped for P-type conductivity. This substrate is overlain by a film 2 of silicon oxide formed withh windows 3 which occupy major areas of the several units A, B, C.

In FIG. 2 we have illustrated the formation of N+ strata 4 in the areas of windows 3 (FIG. 1) by the introduction of corresponding impurities through these windows. Strata 4 are shown overlain by an oxide layer 5.

FIG. 3 illustrates an epitaxially grown silicon layer 6 of N-type conductivity overlying the substrate 1 and the several strata 4; it will be seen that the N+ impurities defining these strata have diffused partly into the substrate and partly into the layer 6. The layer is covered on its exposed surface by an oxide film 7.

FIG. 4 shows the film 7 apertured at windows 8, by the conventional technique of photochemical masking and chemical treatment referred to above, the exposed portions of layer 6 being etched in order to be receptive to impurities to be introduced through the windows 8.

FIG. 5 illustrates the first stage in the subdivision of layer 6 into several mutually isolated sections i.e., the partial diffusion of P-type impurities into zones 9 underneath window apertures 8.

Figure 1:
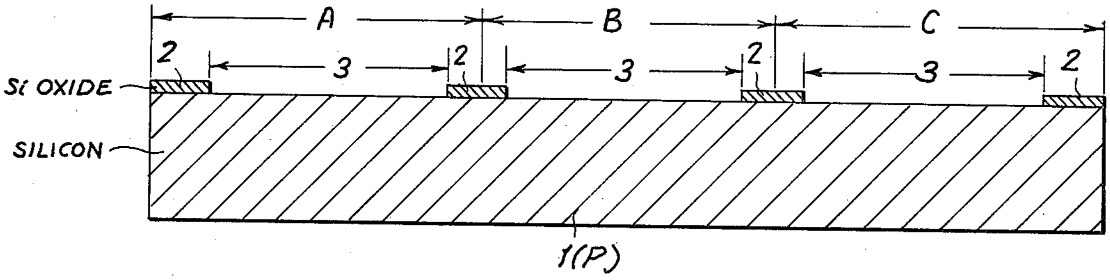
Figure 2:
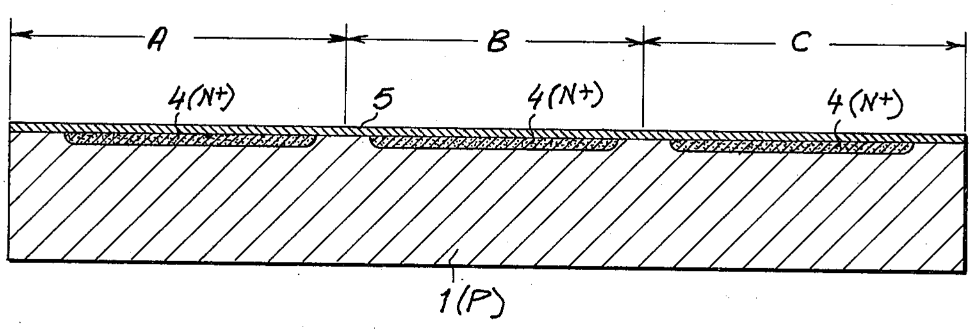
Figure 3:
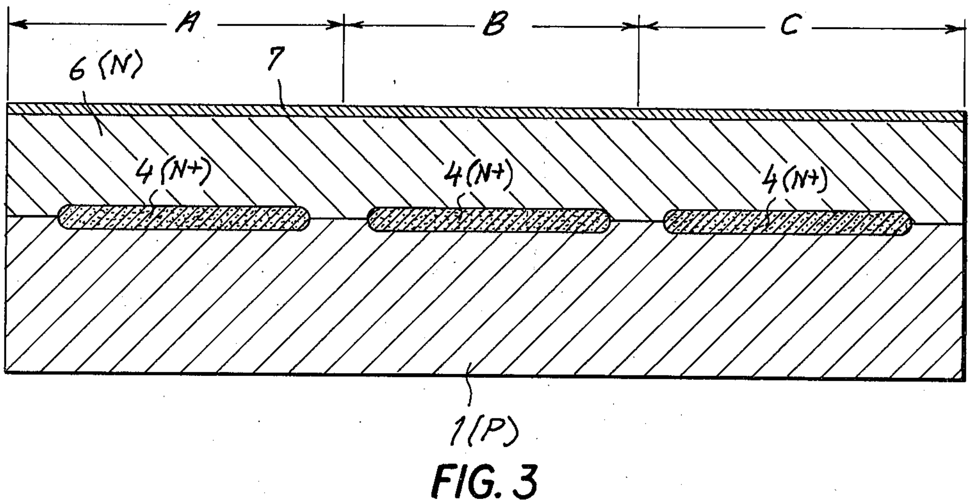
Figure 4:
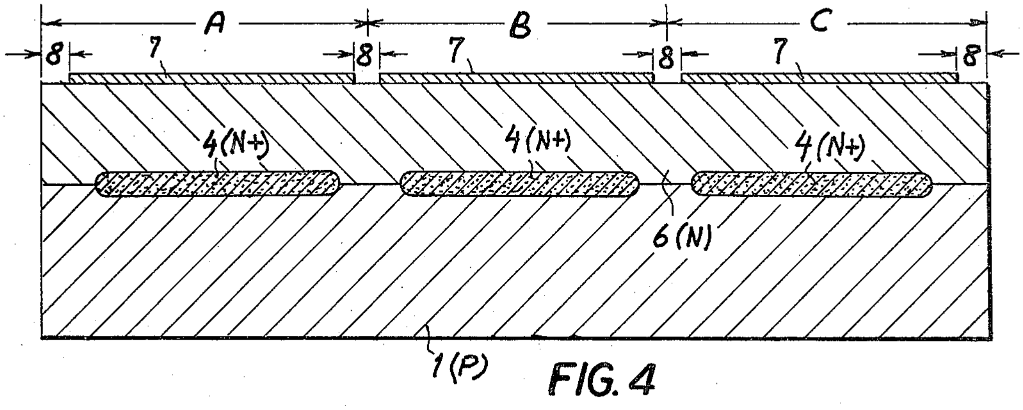
Figure 5:
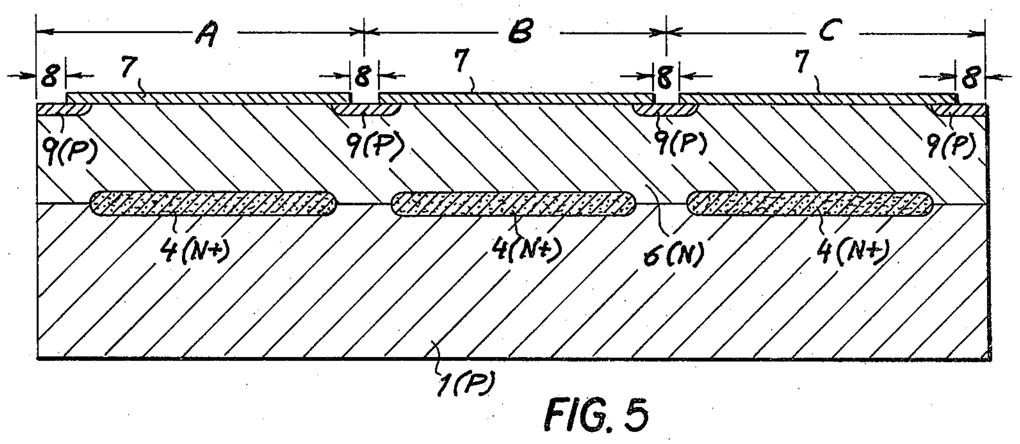
Figure 6:
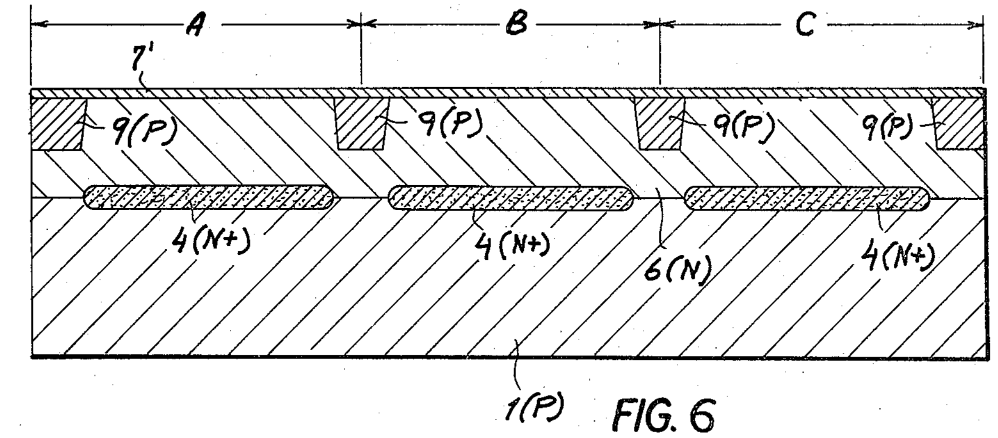
FIG. 6 shows a further stage in which the P zones 9 have grown toward substrate 1, a new oxide film $7^1$ having been grown thereover.
Figure 7:
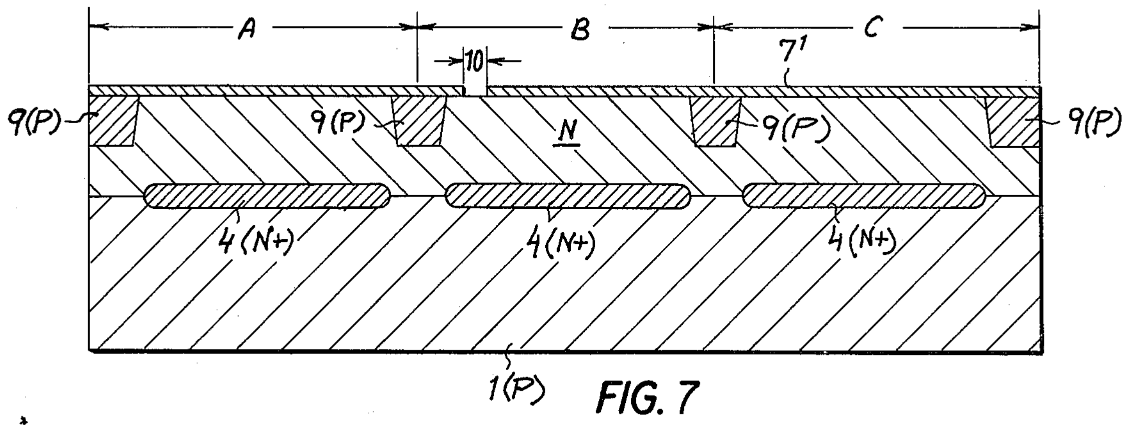
FIG. 7 illustrates the formation of a new window 10 in film $7^1$ along a narrow zone of unit B.
Figure 8:
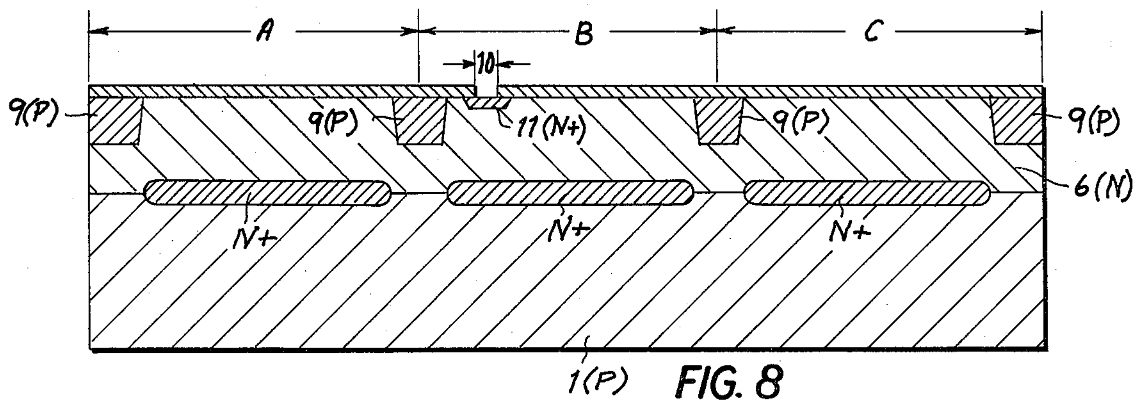
FIG. 8 shows the doping of the area 11 underneath window 10 with N+ impurities.
Figure 9:
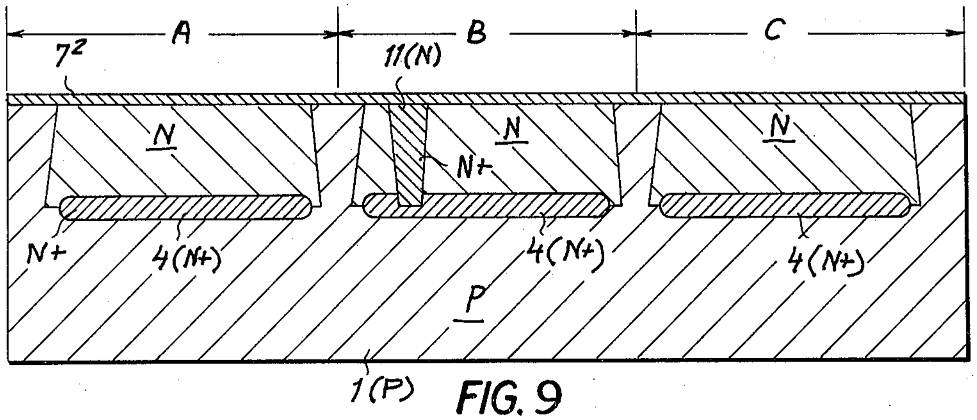

As indicated in FIG. 9, the impurities introduced through window 10 are allowed to diffuse downwardly into the corresponding stratum 4 of N+ conductivity so as effectively to become an upright web unitary therewith; at the same time, the P zones 9 have reached the substrate 1 to form unitary upward extensions of the latter which constitute barriers separating the strata 4 and the corresponding sections of N layer 6 of units A, B and C from one another. The silicon body is now overlain by a new oxide film $7^2$.

Figure 10:
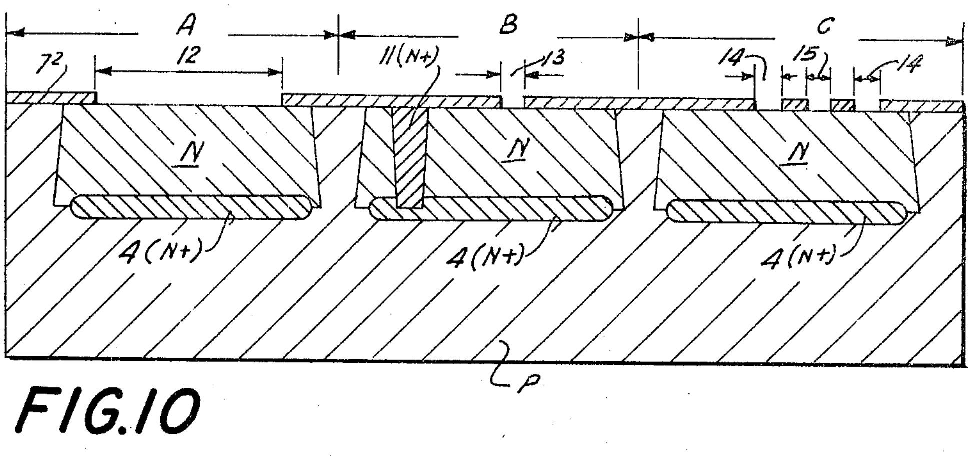

In FIG. 10 we have shown further windows 12, 13, 14 and 15 formed at selected locations in layer $7^2$ at units A, B and C.

Figure 11:
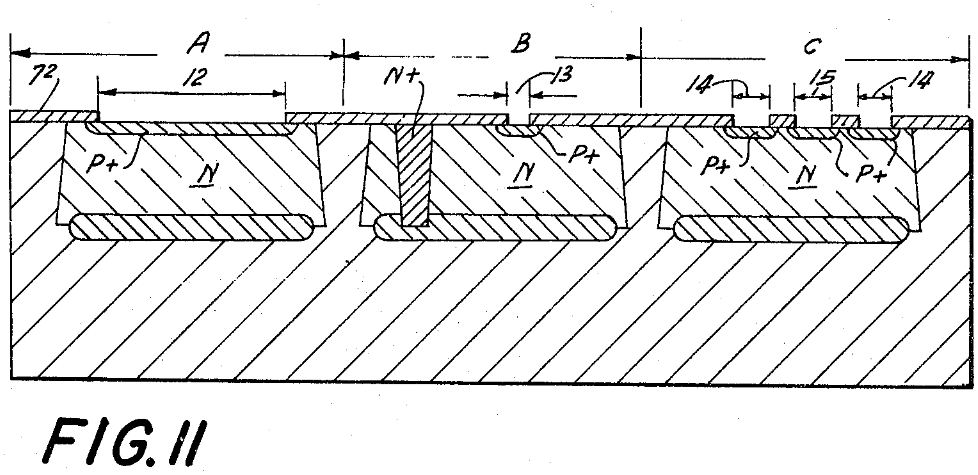

FIG. 11 depicts the doping, with P+ impurities, of the previously etched areas underlying the windows 12–15.

Figure 12:
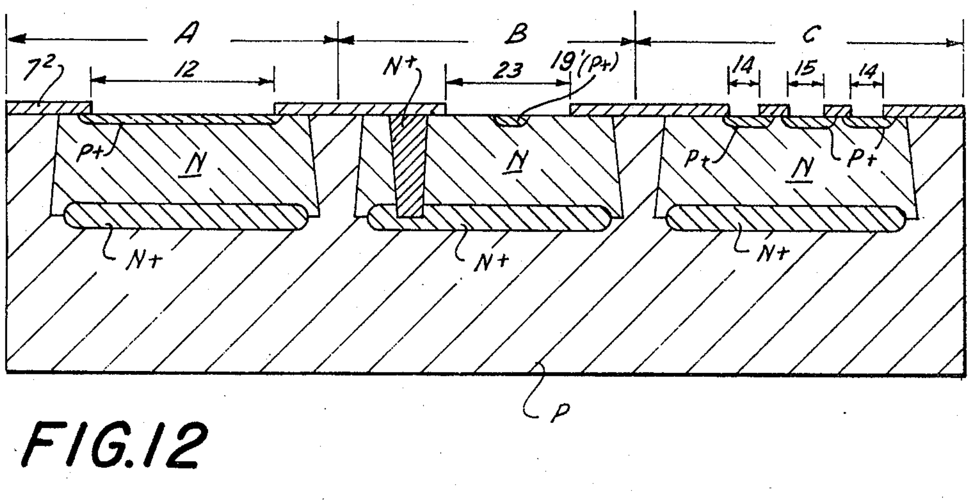

FIG. 12 indicates a widening of the exposed area of N silicon in unit B by a window 23 in layer $7^2$, this window being substantially larger than the window 13 (FIGS. 10 and 11) previously formed in the same general location. Window 23, therefore, extends on both sides beyond the P+ deposit 19' previously introduced through window 13.

Figure 13:
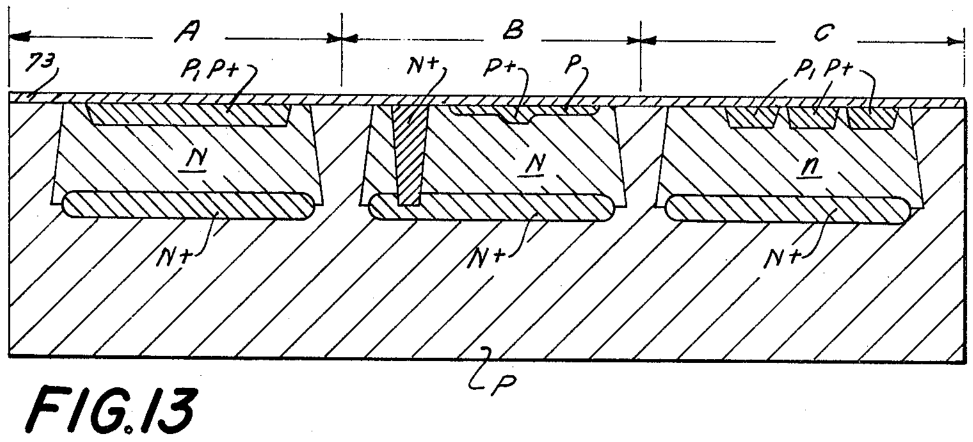

Next, as illustrated in FIG. 13, less concentrated impurities of the same conductivity type (P) are introduced through windows 12, 23, 14 and 15; the resulting deposits are then overgrown by an oxide layer $7^3$.

Figure 14:
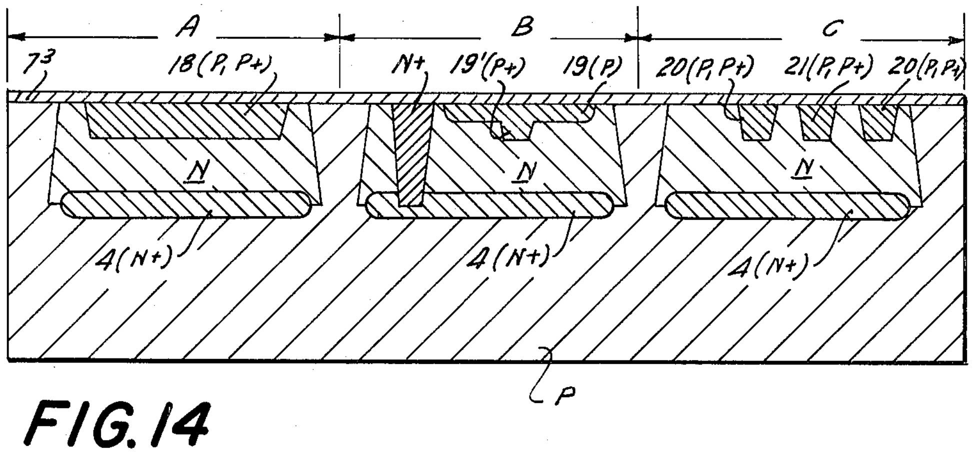

FIG. 14 indicates how the deposits of FIG. 13 are expanded into full-grown enclaves 18, 19 + 19', 20 and 21 penetrating beneath film $7^3$ to a predetermined depth while remaining well spaced from the underlying N+ strata 4.

Figure 15:
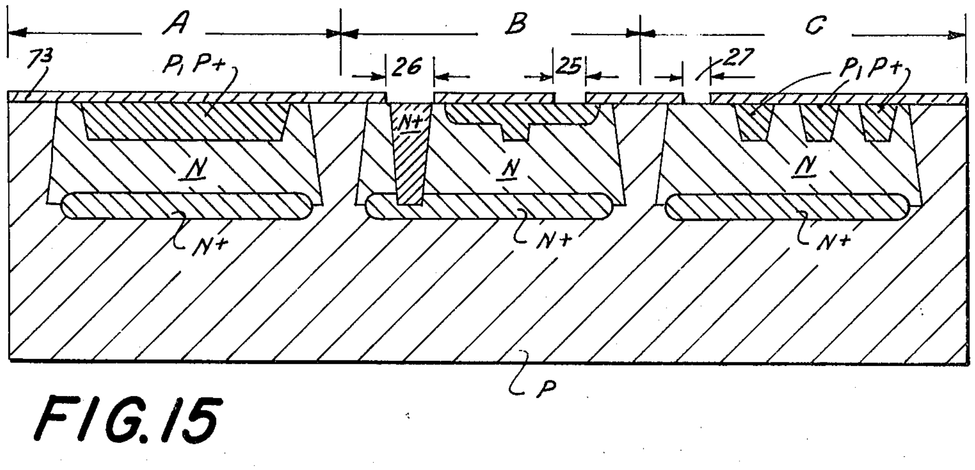
Figure 16:
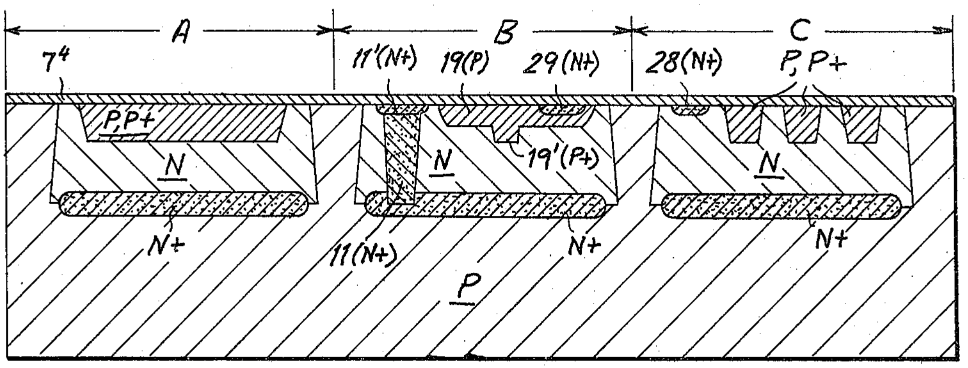

In FIG. 15 the oxide film $7^3$ is shown apertured at 25, 26 in unit B and at 27 in unit C. Window 26 is used for an introduction of N+ impurities into a somewhat widened top portion 11' of the web 11 the same type of doping is applied to enclave 10 via window 25 (zone 29) and to the N layer of unit C through window 27 (zone 28), all as seen in FIG. 16 which also shows an overlying oxide film $7^4$.

Figure 17:
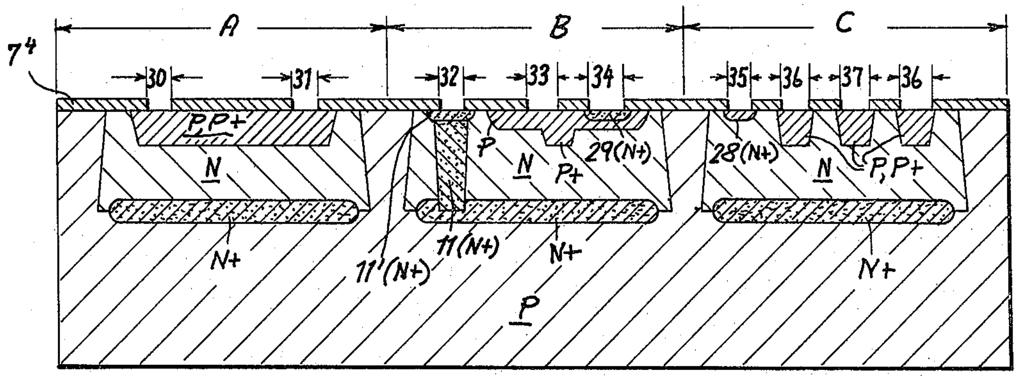

In FIG. 17 the film $7^4$ is apertured at 30 and 31 in unit A, at 32, 33 and 34 in unit B, and at 35, 36, 37 in unit C.

Figure 18:
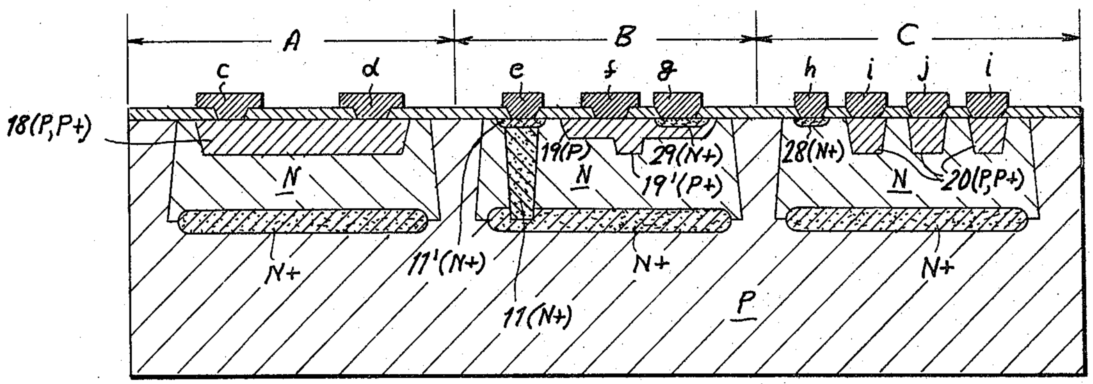

As seen in FIG. 18, windows 30 and 31 serve for the deposition of metal near opposite extremes of the strip-like enclave 18 to form terminals *c* and *d* interconnected by a lowohmic resistance. Window 32 receives a terminal *e* in contact with the upright N+ enclave web 11, 11' to act as a collector electrode of an NPN power transistor whose base and emitter electrodes are formed by terminals *f* in window 33 (contacting the stepped P-type enclave 19,19') and *g* in window 35 (contacting the N+ island 29 of stepped enclave 19,19'). Windows 35, 36 and 37 are respectively occupied by a base terminal *h* contacting the N+ region 28, collector terminals *i* and an emitter terminal *j*, terminals *i* and *j* being in contact with P, P+ enclaves 20, 21 whereas terminal *h* contacts the N+ enclave 28. Terminals *h, i, j* are the electrodes of a PNP lateral transistor.

As described hereinafter with reference to FIG. 20, the relative physical orientation of the enclaves in the overall structure may differ from that schematically illustrated in FIGS. 1 – 18.

Figure 19:
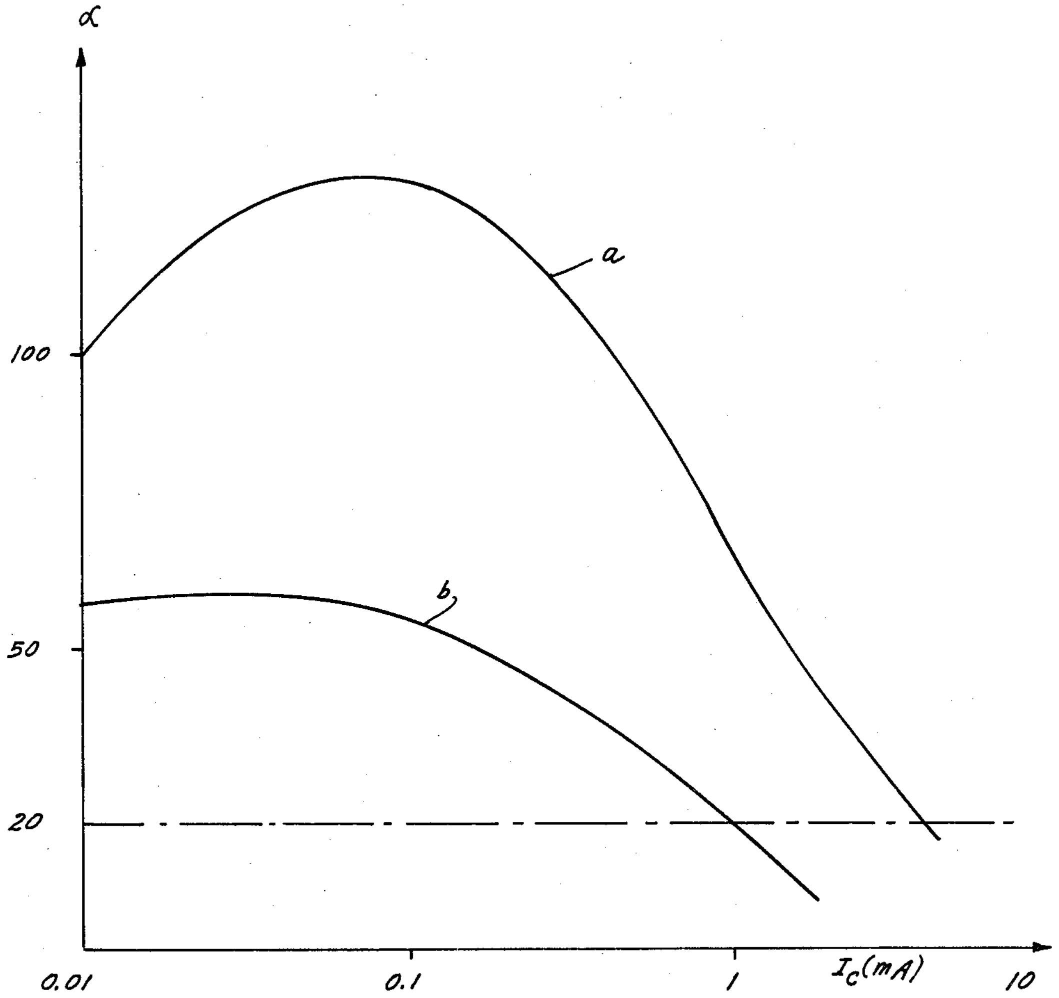

In FIG. 19 we have shown at *a* the gain $\alpha$ of a lateral PNP transistor, of the type schematically illustrated at C in FIG. 18, plotted against the collector current $I_c$ in milliamperes, along with a similar curve *b* for a like transistor produced without the high-concentration preliminary doping (P+) illustrated in FIGS. 11 – 13. It will be noted that the transistor produced by our improved process has a considerably higher gain for a given collector current and that, conversely, the current $I_c$ of this transistor (curve *a*) is substantially greater than that of the control transistor (curve *b*) in a range in which their gains $\alpha$ overlap. Thus, for $\alpha = 20$ the current ratio is about 5:1 so that, in order to realize a given output current, a transistor group five times as large would be required without this preliminary doping step.

We have also determined that a resistive strip 18, produced in this manner, has a substantially lower resistivity than an identically dimensioned strip without preliminary doping, e.g. of 5 – 30Ω compared with 100 – 200Ω per strip. Thus, a resistor composed of a multiplicity of such strips in series (or possibly in parallel) can be dimensioned within much closer tolerance limits than one made from strips of uniform P conductivity.

Figure 20:
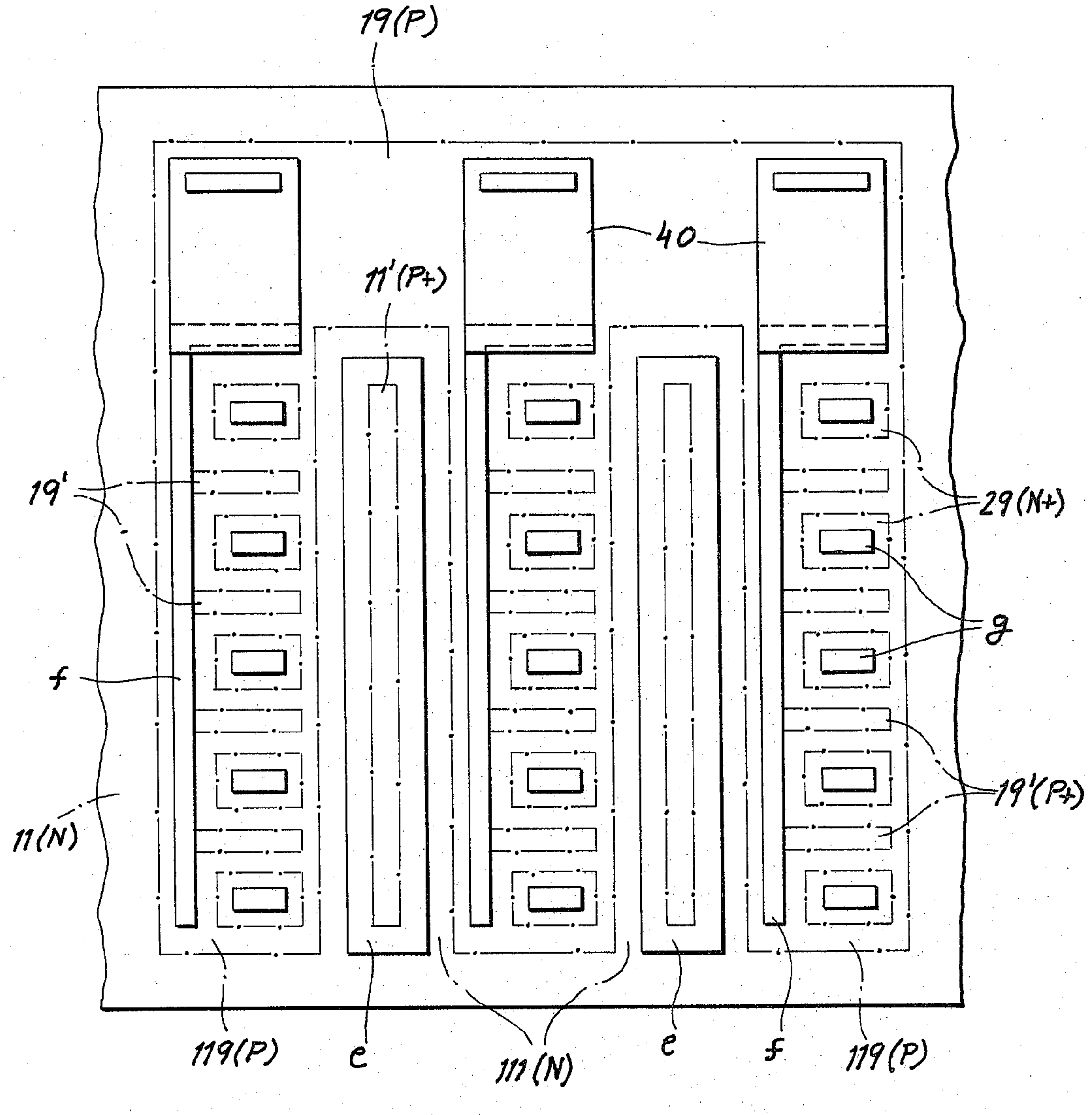

The several units schematically indicated at *a*, *b* and *c* in FIGS. 1 – 18 are representative of more intricate configurations as illustrated in FIG. 20, by way of example, for an array of NPN power transistors included in unit B. From FIG. 20, which employs the same reference characters as FIG. 18, it will be apparent that base area 19 is generally comb-shaped and forms several rectangular strip zones 119 which are interleaved with complementary areas 111 of the associated layer section 11, each of these zones 119 carrying an elongate base contact *f* as well as a multiplicity of emitter contacts *q* whereas each area 111 supports a rectangular collector contact *e*. The short transverse emitter contacts *q* are centered on somewhat larger rectangular zones 29 with N+ doping, these zones being spacedly interleaved with narrow, submerged regions 19' that are doped with P+ impurities. The external connections of terminals *e*, *f* and *q* have not been illustrated, except for tabs 40 secured to the ends of base contacts *f*.

The low resistivity of P+ regions 19' allows the elongate base contacts *f* to extend over the entire length of base strips 119 each coacting with a multiplicity of emitter islands 29. The grouping of five such islands on a single base strip results in a current yield five times as high as could be realized in the absence of highly doped areas 19', with a single emitter island per base strip.

We claim:

1. A process for producing integrated circuitry including several juxtaposed units, comprising the steps of:

a. forming, on a substrate of semiconductive silicon of one conductivity type, a plurality of spaced-apart strata with a highly concentrated doping of the opposite conductivity type;

b. epitaxially growing on said substrate a layer of semiconductive silicon of said opposite conductivity type withh less concentrated doping, thereby imbedding said strata between said substrate and said layer; c thereafter starting a downward growth of barriers between sections of said layer respectively containing said strata by cutting spaced-apart windows in a film of silicon oxide overlying said layer, in intervening regions between said strata, and diffusing impurities of said one conductivity type into said layer through said windows;

d. subsequently cutting a further window in said film above at least one of said sections and diffusing a high concentration of impurities of said opposite conductivity type through said further window to form a web unitary with the underlying stratum simultaneously with the completion of the growth of said barriers into contact with said substrate to isolate said sections from one another;

e. doping selected surface areas of said sections with highly concentrated impurities of said one conductivity type via additional windows formed in said film;

f. thereafter introducing less concentrated impurities of said one conductivity type through said additional windows into enclaves of said sections at said selected surface areas;

g. broadening an additional window formed in step (e) in said one of said sections adjacent said web and thereupon introducing some of said less concentrated impurities of said one conductivity type into said layer through the broadened window to form a stepped enclave;

h. simultaneously letting said highly concentrated and less concentrated impurities of said one conductivity type diffuse to a predetermined depth into said sections to extend said enclaves toward said strata;

and i. applying metallic terminals to said selected surface areas in contact with said enclaves.

2. A process as defined in claim 1 wherein said one conductivity type and said opposite conductivity type are P and N type, respectively.

3. A process as defined in claim 1, comprising the further step of doping a top portion of said web and an island of said stepped enclave remote from said web with highly concentrated impurities of said opposite conductivity type, some of said metallic terminals being positioned in step (i) in contact with said top portion, said island and an intervening portion of said stepped enclave to constitute collector, emitter and base connections of a transistor formed in said layer by said web, said stepped enclave and said island.

* * * * *